US010109409B2

(12) United States Patent
Lee et al.

(10) Patent No.: US 10,109,409 B2
(45) Date of Patent: Oct. 23, 2018

(54) CHIP ELECTRONIC COMPONENT AND BOARD FOR MOUNTING THEREOF

(71) Applicant: SAMSUNG ELECTRO-MECHANICS CO., LTD., Suwon-Si (KR)

(72) Inventors: Dong Hwan Lee, Suwon-Si (KR); Chan Yoon, Suwon-Si (KR); Hye Yeon Cha, Suwon-Si (KR); Jin Woo Han, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 384 days.

(21) Appl. No.: 14/541,552

(22) Filed: Nov. 14, 2014

(65) Prior Publication Data

US 2015/0340149 A1    Nov. 26, 2015

(30) Foreign Application Priority Data

May 21, 2014    (KR) .................. 10-2014-0060769

(51) Int. Cl.
*H05K 1/16*    (2006.01)
*H01F 5/00*    (2006.01)
(Continued)

(52) U.S. Cl.
CPC ..... *H01F 27/2804* (2013.01); *H01F 17/0013* (2013.01); *H01F 27/24* (2013.01);
(Continued)

(58) Field of Classification Search
CPC .... H01F 27/28; H01F 27/2804; H01F 27/292; H05K 1/111; H05K 1/165; H05K 1/181;
(Continued)

(56) References Cited

U.S. PATENT DOCUMENTS 6,051,448 A * 4/2000 Hayama ............ H01F 41/043
                                            438/108
6,218,925 B1 * 4/2001 Iwao ................ H01F 17/0013
                                            336/200
(Continued)

FOREIGN PATENT DOCUMENTS

CN    1222745 A    7/1999
CN    1288240 A    3/2001
(Continued)

OTHER PUBLICATIONS

Chinese Office Action dated Sep. 26, 2016 issued in Chinese Patent Application No. 201410742061.5 (English translation).
(Continued)

*Primary Examiner* — Timothy Thompson
*Assistant Examiner* — Rhadames J Alonzo Miller
(74) *Attorney, Agent, or Firm* — McDermott Will & Emery LLP

(57) ABSTRACT

A chip electronic component may include a magnetic material body including an insulating substrate and coil conductor patterns formed on at least one surface of the insulating substrate, and external electrodes disposed on both end portions of the magnetic material body so as to be connected to end portions of the coil conductor patterns, respectively. In a cross section of the magnetic material body in a length direction, a thickness of an innermost loop/section of the coil conductor patterns may be smaller than a thickness of the remaining loops/sections of the coil conductor pattern.

26 Claims, 7 Drawing Sheets

(51) Int. Cl.
*H01F 27/30* (2006.01)
*H01F 27/28* (2006.01)
*H01F 27/24* (2006.01)
*H01F 27/29* (2006.01)
*H05K 1/11* (2006.01)
*H05K 1/18* (2006.01)
*H01F 17/00* (2006.01)
*H05K 3/24* (2006.01)

(52) U.S. Cl.
CPC .......... *H01F 27/292* (2013.01); *H05K 1/111* (2013.01); *H05K 1/165* (2013.01); *H05K 1/181* (2013.01); *H01F 2017/0066* (2013.01); *H01F 2017/0073* (2013.01); *H01F 2027/2809* (2013.01); *H05K 3/241* (2013.01); *H05K 2201/0347* (2013.01); *H05K 2201/086* (2013.01); *H05K 2201/098* (2013.01); *H05K 2201/09727* (2013.01); *H05K 2201/09736* (2013.01); *H05K 2201/1003* (2013.01); *H05K 2201/10636* (2013.01); *H05K 2203/1476* (2013.01); *Y02P 70/611* (2015.11)

(58) Field of Classification Search
CPC .......... H05K 2201/09727; H05K 2201/09736; H05K 2201/098
USPC ................................... 174/260; 336/200, 208
See application file for complete search history.

(56) References Cited

U.S. PATENT DOCUMENTS

| | | | | |
|---|---|---|---|---|
| 6,437,677 | B1 * | 8/2002 | Takeuchi | H01F 17/0013 336/200 |
| 7,176,773 | B2 | 2/2007 | Shoji | |
| 2002/0067235 | A1 * | 6/2002 | Ueda | H01F 17/0006 336/200 |
| 2003/0137384 | A1 * | 7/2003 | Itou | H01F 17/0013 336/200 |
| 2004/0164835 | A1 * | 8/2004 | Shoji | H01F 17/0013 336/200 |
| 2005/0188529 | A1 * | 9/2005 | Uriu | H01F 17/0013 29/602.1 |
| 2005/0195062 | A1 * | 9/2005 | Yoshida | H01F 27/2804 336/200 |
| 2007/0085649 | A1 * | 4/2007 | Park | H01F 17/0006 336/200 |
| 2007/0247268 | A1 * | 10/2007 | Oya | H01F 17/0006 336/200 |
| 2009/0243780 | A1 * | 10/2009 | Inoue | H01F 1/15366 336/200 |
| 2009/0322458 | A1 | 12/2009 | Lee et al. | |
| 2010/0052835 | A1 * | 3/2010 | Lee | H01F 17/04 336/83 |
| 2010/0259353 | A1 * | 10/2010 | Saito | H01F 27/292 336/205 |
| 2013/0147592 | A1 * | 6/2013 | Yoo | H01F 5/003 336/200 |
| 2013/0222101 | A1 * | 8/2013 | Ito | H01F 17/04 336/83 |
| 2013/0335186 | A1 | 12/2013 | Chang et al. | |

FOREIGN PATENT DOCUMENTS

| | | | | |
|---|---|---|---|---|
| CN | 1523617 | A | | 8/2004 |
| CN | 101620916 | A | * | 1/2010 |
| CN | 103377795 | A | | 10/2013 |
| EP | 0 929 085 | A2 | | 7/1999 |
| EP | 1085538 | A1 | * | 3/2001 ......... H01F 27/2804 |
| JP | H07-037728 | | | 2/1995 |
| JP | 11-204337 | A | | 7/1999 |
| JP | 11-260644 | A | | 9/1999 |
| JP | 2001-085230 | A | | 3/2001 |
| JP | 2002-134319 | A | | 5/2002 |
| JP | 2004-253684 | A | | 9/2004 |
| JP | 2005-243752 | A | | 9/2005 |
| JP | 2006-278912 | A | | 10/2006 |
| JP | 2006-310716 | A | | 11/2006 |
| JP | 2009-117546 | A | | 5/2009 |
| JP | 2010-016337 | A | | 1/2010 |
| JP | 2011-103343 | A | | 5/2011 |
| JP | 2012-248629 | A | | 12/2012 |
| JP | 2012-248630 | A | | 12/2012 |
| KR | 10-2007-0041867 | | | 4/2007 |

OTHER PUBLICATIONS

Second Office Action dated May 31, 2017 issued in Chinese Patent Application No. 201410742061.5 (with English translation).
Japanese Office Action dated Feb. 7, 2017 issued in Japanese Patent Application No. 2014-232500 (with English translation).

\* cited by examiner

CHIP ELECTRONIC COMPONENT AND BOARD FOR MOUNTING THEREOF

CROSS-REFERENCE TO RELATED APPLICATION

This application claims the benefit of Korean Patent Application No. 10-2014-0060769 filed on May 21, 2014, with the Korean Intellectual Property Office, the disclosure of which is incorporated herein by reference.

BACKGROUND

The present disclosure relates to a chip electronic component and a board for the mounting thereof.

An inductor, a chip electronic component, can be a representative passive element configuring an electronic circuit and can be used together with a resistor and a capacitor for example to remove noise. Such an inductor can be combined with such a capacitor using electromagnetic property to configure a circuit such as a resonance circuit, a filter circuit, or the like, and can be used, for example, for amplifying a signal in a specific frequency band.

Recently, as the miniaturization and thinning of various information technology (IT) devices, such as communications devices, display devices, or the like, have accelerated, research into technology related to the miniaturizing and thinning of various elements such as inductors, capacitors, transistors, and the like, included in such IT devices has been continuously conducted. Therefore, inductors have rapidly been replaced in some applications by small, high density chips capable of being automatically surface-mounted, and thin film type inductor such as where mixtures of a magnetic powder and a resin can be formed as coil patterns formed on upper and lower surfaces of a thin film insulating substrate by plating have been developed.

Thin film type inductors can be manufactured by forming coil patterns on an insulating substrate and filling an outer portion with a magnetic material.

Various techniques of plating can be important in order to improve direct current (DC) resistance (Rdc) among important characteristics of the inductor. In some cases, an anisotropic plating method in which plating is performed by applying a high density current to only or to preferentially or to primarily grow plating in a direction, such as an upward direction of a coil can be used.

In some embodiments, in a substrate plating process of forming a coil of an inductor, an insulating material such as a solder resist (SR), a dry film resist (DFR), or the like, can be applied to a specific portion of the coil for example to allow secondary lead wire plating, after a primary pattern plating process.

However, generally, when a secondary lead wire plating process is used after a primary pattern plating process, internal pattern plating layers, except for the outermost pattern plating layer and the innermost pattern plating layer, have plating widths and thicknesses that are substantially similar to each other due to the presence of plating layers adjacent thereto in both directions.

However, the outermost pattern plating layer and the innermost pattern plating layer, each of which do not have plating layers adjacent thereto in one direction, can have excessive plating formed in one direction in a secondary lead wire plating process. As a result, the outermost coil conductor pattern and the innermost coil conductor pattern generally have a plating width larger than those of internal coil conductor patterns.

Alternatively, coil conductor patterns configuring an inductor a coil structure having improved inductor characteristics, can have coil conductor loops/sections gradually reduced in thickness/width, vertically, horizontally or some combination of vertical and horizontal, from the outermost coil conductor loop/section toward the innermost coil conductor loop/section, for example, from an outer portion of a magnetic material body toward an inner portion thereof. In some embodiments, the gradual reduction in thickness/width can occur over all of the loops/sections and in some embodiments, the gradual reduction in thickness/width can be interrupted with coils of a different thickness/width, such as a larger thickness/width or can occur over only a subset of the loop/sections. In some embodiments, an inner coil loop/section can have a thickness/width the same as other or all inner loops/sections or the same as the outermost or innermost loop/section. In some embodiments, only the innermost loop/section. In some embodiments where there is more than one coil conductor pattern, the coil conductor patterns can be substantially the same as one another or different from one another.

However, coil structures made previously by substrate plating processes have not included the above-described improved coil structure features. As a result, previous coil patterns have limitations in the characteristics of inductors made by substrate plating processes.

RELATED ART DOCUMENT

Japanese Patent Laid-Open Publication No. 1999-204337

SUMMARY

Some embodiments in the present disclosure may provide a chip electronic component and a board for mounting thereof.

According to some embodiments in the present disclosure, a chip electronic component may include a magnetic material body including an insulating substrate and one or more coil conductor patterns disposed on at least one surface of the insulating substrate, and external electrodes disposed on, for example, both end portions of the magnetic material body to be connected to end portions of the coil conductor pattern (s), respectively. In a cross section of the magnetic material body in a length direction, a thickness of the innermost coil conductor loop/section of a coil conductor pattern may be smaller than a thickness of one or more other coil conductor loop/section of the coil conductor pattern.

According to some embodiments in the present disclosure, a chip electronic component may include a magnetic material body including an insulating substrate and coil conductor patterns disposed on at least one surface of the insulating substrate, and external electrodes disposed, for example, on both end portions of the magnetic material body to be connected to end portions of the coil conductor patterns, respectively. In the case that in a cross section of the magnetic material body in a length direction, a width of respective innermost loop/section of the coil conductor pattern is Wo1 and a width of another internal (i.e. non-outermost) coil loop/section is Wi, Wo1<Wi may be satisfied.

According to some embodiments in the present disclosure, a chip electronic component may include a magnetic material body including an insulating substrate and one or more coil conductor patterns disposed on at least one surface of the insulating substrate, and external electrodes disposed, for example, on both end portions of the magnetic material body to be connected to end portions of the coil conductor patterns, respectively. In a cross section of the magnetic material body in a length direction, a width of the innermost loop/section of the coil conductor pattern is Wo1 and a width of the outermost loop/section of the coil conductor pattern is Wo2, wherein Wo1<Wo2.

According to some embodiments in the present disclosure, a chip electronic component may include a magnetic material body including an insulating substrate and one or more coil conductor patterns disposed on at least one surface of the insulating substrate, and external electrodes disposed, for example, on both end portions of the magnetic material body to be connected to end portions of the coil conductor patterns, respectively. In a cross section of the magnetic material body in a length direction, the innermost loop/section of the coil conductor pattern may comprise or consist of pattern plating layers, and one or more of the remaining loops/sections of the coil conductor pattern, or alternatively all of the remaining loops/sections, may include pattern plated layers and optionally electroplated layers formed on the pattern plating layers. In some embodiments, the innermost loop/section is only pattern plated while one or more of the remaining loops/sections, or alternatively all of the remaining loops/sections may include pattern plated layers and optionally electroplated layers formed on the pattern plating layers.

According to some embodiments in the present disclosure, a board for mounting of a chip electronic component may include a printed circuit board having first and second electrode pads disposed on the printed circuit board, and the chip electronic component as described above installed on the printed circuit board. In some embodiments, the printed circuit board having the chip electronic component described above can be a part of a larger circuit with other components.

BRIEF DESCRIPTION OF DRAWINGS

The above and other aspects, features and other advantages in the present disclosure will be more clearly understood from the following detailed description taken in conjunction with the accompanying drawings, in which.

DETAILED DESCRIPTION

Figure 1:
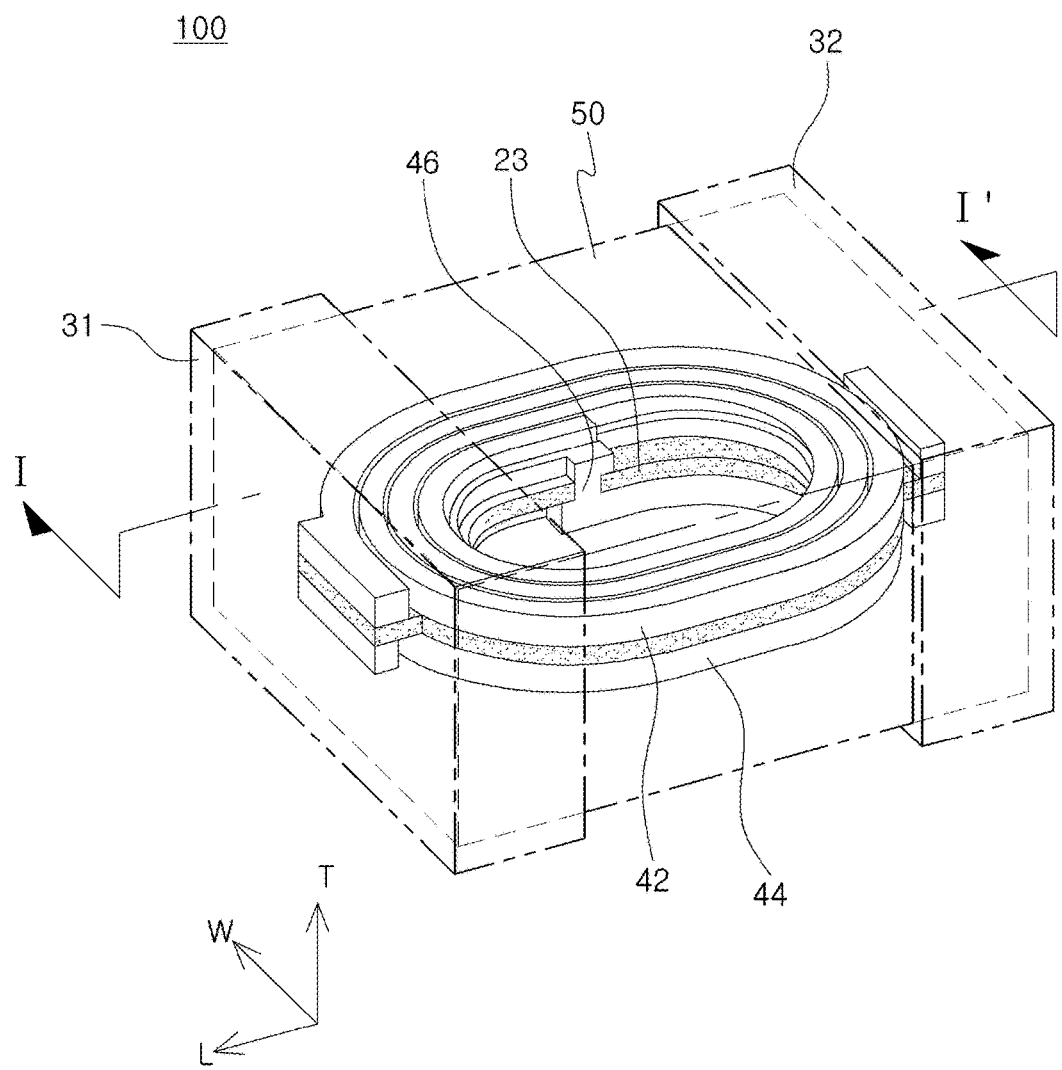
FIG. 1 is a schematic perspective view illustrating a chip electronic component according to an exemplary embodiment in the present disclosure, in which an internal coil pattern of the chip electronic component is viewed.

Embodiments in the present disclosure will now be described in detail with reference to the accompanying drawings.

Embodiments may, however, be embodied in many different forms and should not be construed as being limited to embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity.

Chip Electronic Component

A chip electronic component according to an exemplary embodiment of the present disclosure, namely, a thin film type inductor will be described. However, the present disclosure is not limited thereto.

FIG. 1 is a schematic perspective view illustrating a chip electronic component according to an exemplary embodiment in the present disclosure, in which an internal coil pattern of the chip electronic component is viewed.

Figure 2:
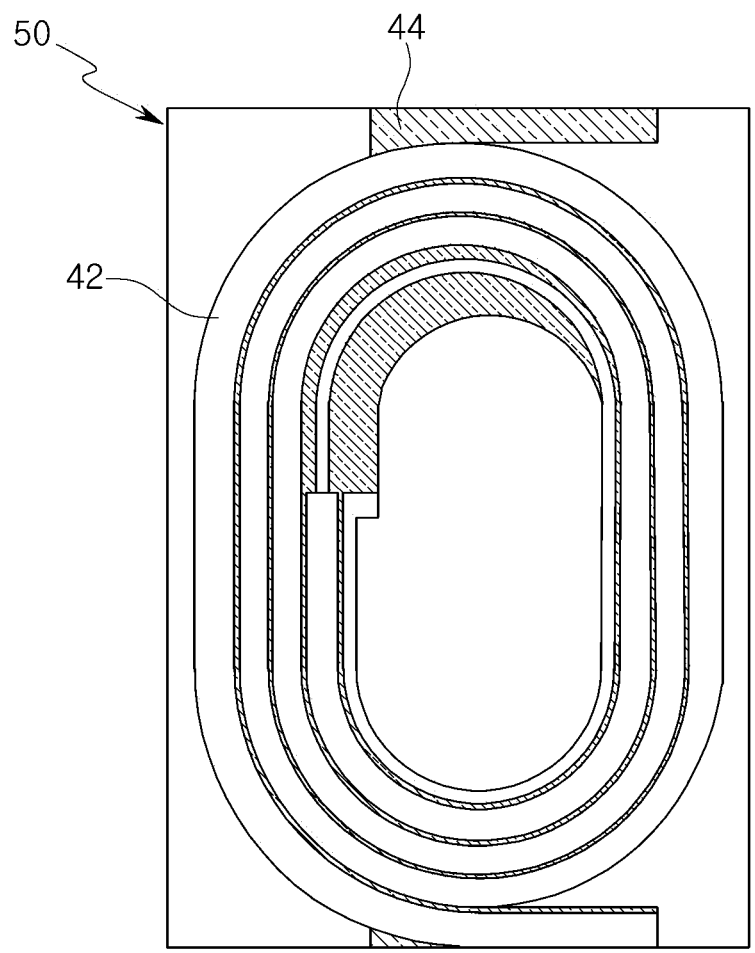
FIG. 2 is a top view of a chip electronic component according to an exemplary embodiment in the present disclosure.

FIG. 2 is a top view of a chip electronic component according to an exemplary embodiment of the present disclosure.

Figure 3:
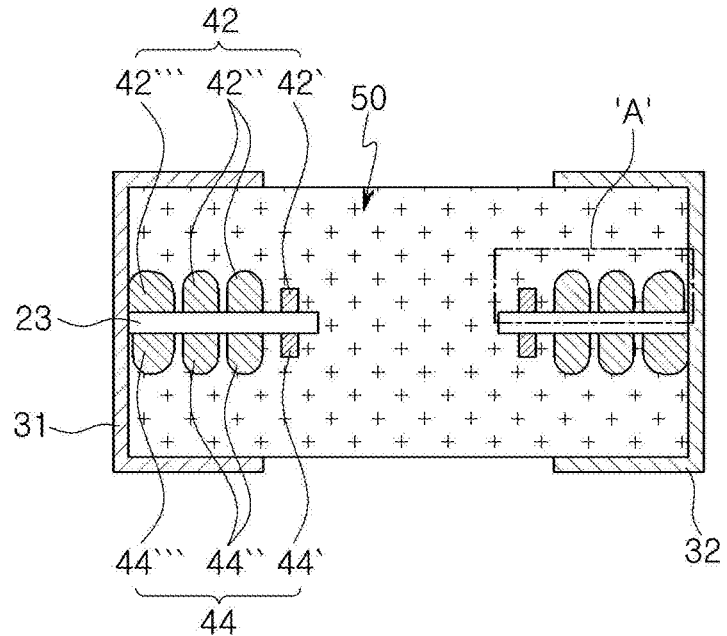
FIG. 3 is a cross-sectional view taken along line I-I' of FIG. 1.

FIG. 3 is a cross-sectional view taken along line I-I' of FIG. 1.

Figure 4:
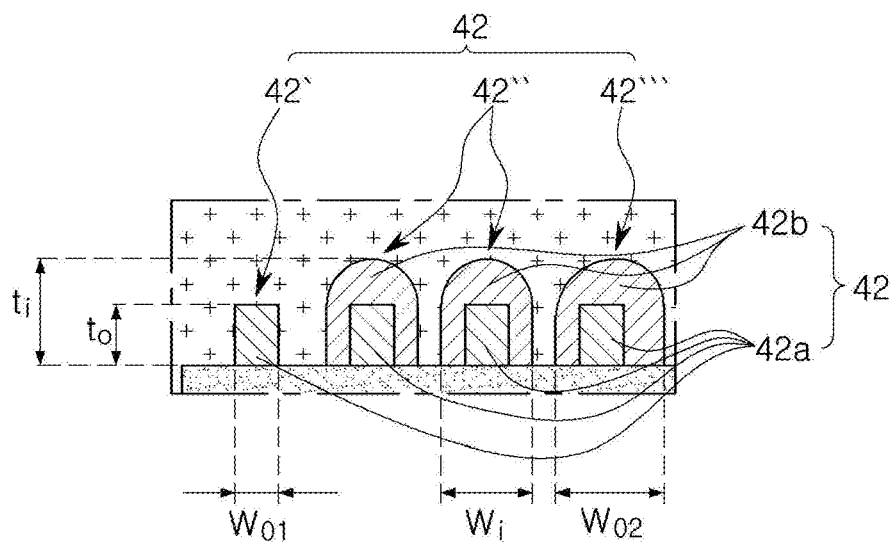
FIG. 4 is an enlarged schematic view of part A of FIG. 3.

FIG. 4 is an enlarged schematic view of part A of FIG. 3.

Referring to FIGS. 1 through 4, as an example of a chip electronic component, a thin film type inductor 100 used in a power line of a power supply circuit is provided. The chip electronic component may be appropriately applied as chip beads, a chip filter, and the like.

The thin film type inductor 100 may include a magnetic material body 50, an insulating substrate 23, and coil conductor patterns 42 and 44.

The thin film type inductor 100 may be manufactured by forming the coil conductor patterns 42 and 44 on the insulating substrate 23 and filling an outer portion with a magnetic material.

Various techniques of plating may be important in order to improve direct current (DC) resistance (Rdc) among important characteristics of the thin film type inductor 100. In some embodiments, an anisotropic plating method can be used, such as one of applying high density current to grow plating in only/preferentially/primarily in a direction, such as an upward direction of a coil can be used.

In some embodiments, an insulating substrate plating process of forming the coil of the inductor can be performed where an insulating material such as a solder resist (SR), a dry film resist (DFR), or the like, may be applied to a specific portion of the coil as a part of performing a secondary plating, after a primary pattern plating process.

In some embodiments, a pattern plating layer may be formed by the primary pattern plating process. In this process, a photo-resist resin may be applied to the insulating substrate, the coil conductor patterns may be exposed, transferred, and developed to allow the photo-resist to remain in a portion in which light is not irradiated. In this state, when plating is performed and the remaining photo-resist is removed, the pattern plating layer may be formed.

In some embodiments, after the primary pattern plating process, the second plating may be performed on the insulating substrate to grow the pattern plating layer or a portion of the pattern plating layer, thereby disposing the coil conductor patterns 42 and 44 on and/or below the insulating substrate 23.

In some embodiments, a general thin film type inductor may require a high inductance (L) and a low DC resistance (Rdc) and may be mainly used, for example, in the case in which a deviation between inductance values in each frequency should be relatively small. In some embodiments, a general thin film type inductor with higher inductance (L) and/or lower DC resistance (Rdc) is desirable, such as in the case in which a deviation between inductance values in each frequency should be relatively small. In such situations, the number of and dimensions of one or more of the loops/sections of the inductors described herein can be modified as described herein.

The magnetic material body 50 may form an outer casing of the thin film type inductor 100 and may be formed using any material that exhibits magnetic properties. For example, the magnetic material body 50 may be formed using ferrite or a metal based soft magnetic material.

Suitable examples of ferrite-based material can include Mn—Zn based ferrite, Ni—Zn based ferrite, Ni—Zn—Cu based ferrite, Mn—Mg based ferrite, Ba based ferrite, Li based ferrite, or the like, as well as combinations thereof.

Suitable examples of metal-based soft magnetic material can include alloys containing any one or more selected from a group consisting of Fe, Si, Cr, Al, and Ni. For example, the metal based soft magnetic material may contain Fe—Si—B—Cr based amorphous metal particles, but is not limited thereto. Suitable materials may be amorphous or otherwise.

In some embodiments, metal based soft magnetic material may include particles, and the particles can have a particle size of 0.1 to 30 µm, or about 0.1 to about 2 µm, or about 0.3 to about 6 µm or about 0.5 to about 5 µm, or about 0.5 to about 10 µm, or about 1 to about 10 µm, or about 1 to about 20 µm, or about 2 to about 20 µm, or about 3 to about 30 µm and may be contained in any suitable material, such as a material comprising, consisting essentially of or consisting of a polymer such as an epoxy resin, polyimide, or the like, and combinations thereof, in a form in which is the particles are dispersed in the polymer.

The magnetic material body 50 may have a hexahedral shape. Directions of a hexahedron will be defined in order to clearly describe an exemplary embodiment in the present disclosure. L, W and T shown in FIG. 1 refer to a length direction, a width direction, and a thickness direction, respectively. In some cases, two of these directions can be switched, to change the orientation of the device, such as where the length direction and the width direction or the width and the thickness direction or the length and the thickness directions are switched.

The insulating substrate 23 formed in the magnetic material body 50 may be configured of a thin film and may be formed using any material that may form the coil conductor patterns 42 and 44 by plating. The insulating substrate 23 may be, for example, a printed circuit board (PCB), a ferrite substrate, a metal based soft magnetic substrate, or the like.

The insulating substrate 23 may have a hole formed in a central portion thereof so as to penetrate therethrough, and the hole may be filled or partially filled with a magnetic material such as ferrite, a metal based soft magnetic material, or the like, as well as combinations thereof, to form a core part. The core part filled with the magnetic material may be formed, thereby increasing an inductance (L).

The insulating substrate 23 may have the coil conductor patterns 42 and 44 formed on one surface and the other surface thereof, and the coil conductor patterns 42 and 44 have coil shaped patterns, respectively.

One or both of the coil conductor patterns 42 and 44 may include coil patterns having a helical shape, and the coil conductor patterns 42 and 44 formed on one surface and the other surface of the insulating substrate 23 may be electrically connected to each other through a via electrode 46 formed in the insulating substrate 23 or by other means.

The coil conductor patterns 42 and 44 and the via electrode 46 may be formed using a metal such as a metal having high electrical conductivity and can include, for example, silver (Ag), palladium (Pd), aluminum (Al), nickel (Ni), titanium (Ti), gold (Au), copper (Cu), platinum (Pt), or alloys thereof, etc.

Meanwhile, although not shown in the accompanying drawings, an insulating film may be formed on one or more of the surfaces of the coil conductor patterns 42 and 44.

The insulating film may be formed by a commonly known method such as a screen printing method, an exposure and development method of a photo-resist (PR), a spray applying method, a dipping method, or the like.

The insulating film may be formed using any material that may form a film, such as a thin film, for example, a photo-resist (PR), an epoxy based resin, or the like.

One end portion of the coil conductor pattern 42 formed on one surface of the insulating substrate 23 may be exposed to one end surface of the magnetic material body 50 in the length direction, and one end portion of the coil conductor pattern 44 formed on the other surface of the insulating substrate 23 may be exposed to the other end surface of the magnetic material body 50 in the length direction.

External electrodes 31 and 32 may be disposed on both end surfaces of the magnetic material body 50 in the length direction, respectively, so as to be connected to the coil conductor patterns 42 and 44 exposed to both end surfaces of the magnetic material body 50 in the length direction, respectively.

One or more of the external electrodes 31 and 32 may be extended to upper and/or lower surfaces of the magnetic material body 50 in the thickness direction thereof and/or one or both side surfaces of the magnetic material body 50 in the width direction thereof.

In addition, as another example, the external electrodes 31 and 32 may be disposed on a lower surface of the magnetic material body 50 and be extended to both end surfaces of the magnetic material body 50 in the length direction.

For example, the external electrodes 31 and 32 are not limited to being disposed in a particular form, but may be disposed in various forms.

The external electrodes 31 and 32 may be formed using a metal having excellent electrical conductivity, for example, nickel (Ni), copper (Cu), tin (Sn), silver (Ag), or alloys thereof, etc.

Referring to FIG. 1, the coil conductor patterns 42 and 44 may be disposed in a form in which they are provided in parallel to the lower surface of the magnetic material body 50, but are not limited thereto. For example, the coil conductor patterns 42 and 44 may be disposed in a form in which they are perpendicular to the lower surface of the magnetic material body 50.

According to an exemplary embodiment of the present disclosure, in a cross section of the magnetic material body 50 in the length direction, a thickness of the respective innermost coil conductor patterns 42' and 44' of the coil conductor patterns 42 and 44 may be smaller than a thickness ti of remaining coil conductor patterns 42", 42''', 44", and 44''' thereof.

Generally, in a secondary lead wire plating process after the primary pattern plating process, internal pattern plating layers except for the outermost pattern plating layer and the innermost pattern plating layer may have plating widths and thicknesses that are substantially similar to each other due to plating layers adjacent thereto in both directions.

On the other hand, the outermost pattern plating layer and the innermost pattern plating layer do not have plating layers adjacent thereto in one direction, such that excessive plating may be formed in one direction in the secondary lead wire plating process. As a result, the outermost coil conductor pattern and the innermost coil conductor pattern may generally have a plating width larger than those of other coil conductor patterns.

In some embodiments, in coil conductor patterns configuring the inductor, an optimized coil structure for improving characteristics of the inductor may be that widths and/or thicknesses of coils decrease from the outermost coil conductor pattern toward the innermost coil conductor pattern, for example, from an outer portion of the magnetic material body toward an inner portion thereof. Such a decrease in widths or thickness can occur continuously or stepwise, having one or more steps. In some embodiments, two or more of an inner loop/section (non-outermost, non-innermost) or an inner loop/section and one of outermost/innermost can have the same width and/or thickness and two or more of an inner loop section or an inner loop/section and one of outermost/innermost can increase in width and/or thickness moving from a more outward to a more inward loop/section.

In some preferred embodiments, a coil structure disclosed herein for improving characteristics of an inductor may be that the widths and the thicknesses of the coils decrease from the outer portion of the magnetic material body toward the inner portion thereof.

One approach to implementing a high inductance required by the thin film type inductor is to increase the number of coil turns which leads to coils having a relatively thin conducting path being used. In such a case, a DC resistance (Rdc) value of the coils can increase and an alternating current (AC) resistance of the coils at a high frequency can also increase, resulting in a reduced quality factor (Q) of the inductor.

However, in embodiments of the inductor disclosed herein in a cross section of the device in, for example, the length direction, the thickness of the innermost coil conductor patterns 42' and 44' of the coil conductor patterns 42 and 44 may be controlled so as to be smaller than the thickness the inner loops/sections, ti, and the outermost loop/section (e.g. 42", 42''', 44", and 44''') of the coil conductor pattern, resulting in an improved coil structure. In addition, a quality factor, for example, a Q factor, of the chip inductor may be improved and an improvement in DC resistance (Rdc) characteristics can be exhibited, such as by reducing the DC resistance (Rdc), or not increasing the DC resistance by as much as would otherwise have occurred to achieve the same size and inductor properties (e.g. inductance).

The thickness of the respective innermost coil conductor patterns 42' and 44' is controlled so as to be smaller than the thickness ti of one, some or all of the inner and outermost loops/sections of the coil conductor pattern (e.g. 42", 42''', 44", and 44''') to suppress an increase in the AC resistance of the coils at the high frequency, whereby the quality factor, for example, the Q factor, of the chip inductor may be improved.

In addition, the thickness of the respective innermost coil conductor patterns 42' and 44' is controlled so as to be smaller than the thickness ti of one or some or all of the remaining coil conductor patterns (e.g. 42", 42''', 44", and 44'''), such that a volume of the magnetic material is increased, whereby the inductance and the DC resistance (Rdc) may be improved.

In FIG. 3, the innermost loop/section of the coil conductor pattern, namely 42' and 44', are smaller than all of the other loops/sections of the coil conductor patter. However, in other embodiments, more than just the innermost loop/section can be the smallest/narrowest/thinnest, such as where the innermost and one or more inner loops/sections are smaller than the rest of the loops/sections. For example, the respective innermost loops/sections of the coil conductor pattern 42' and 44' and the next most innermost one or more adjacent loops/sections of the coil conductor pattern can be the smallest/narrowest/thinnest.

According to an exemplary embodiment of the present disclosure, the innermost loop/section of the coil conductor pattern 42' may be configured of a pattern plating layer 42a only, and other loops/sections of the coil conductor pattern 42" and 42''' may include the pattern plating layers with electroplating layers 42b formed on the pattern plating layers, and in some embodiments, the innermost loop/section of the coil conductor pattern 42' may have a thickness smaller than that of other loops/sections of the respective remaining coil conductor pattern 42" and 42'''.

In some embodiments, the innermost loop/section of the coil conductor pattern 42' can be configured such that a cross section of the innermost coil conductor pattern 42' may have a shape similar to a rectangular shape. In some embodiments, areas occupied by the innermost loop/section of the coil conductor pattern, 42' and 44', in the same space may be wider, and have improved DC resistance (Rdc).

A method of implementing the optimized coil structure in which the thicknesses of the coils or loops/sections decrease from the outer portion of the magnetic material body 50 toward the inner portion thereof by controlling the thickness of the respective innermost loop/section of the coil conductor pattern 42' and 44' so as to be smaller than the thickness ti of the inner and outermost coils/loops of the coil conductor pattern (e.g. 42", 42''', 44", and 44''', and optionally additional inner loops/sections), but is not limited thereto, may be implemented by suppressing growth of the innermost loop/section, 42' and/or 44', in the thickness direction, for example, in the case in which the secondary lead wire plating is applied to the innermost coil conductor patterns 42' and 44'.

In some embodiments, a method of suppressing the growth of the innermost coil conductor patterns 42' and 44' in the thickness direction may be implemented by installing dams or barriers (hereinafter "dams") on side surfaces and/or upper surfaces of the innermost loops/sections 42' and 44'.

For example, the dams can be installed at predetermined intervals on the side surfaces and/or the upper surfaces of the loops/sections, 42' and 44', whereby the growth of the innermost loops/sections 42' and 44' in thickness may be suppressed even when the secondary lead wire plating is applied to the innermost loops/sections 42' and 44'.

In some embodiments, the dams can be installed on the side surfaces and/or the upper surfaces of the pattern plating layer 42a previously formed, and the dams can be installed in order to prevent or limit growth of an electroplating layer 42b on the innermost loop/section 42', such as electroplating to provide a secondary lead wire, whereby the respective innermost coil conductor pattern 42' may be implemented so as to have a thickness smaller than that of the inner and outermostloops/sections (e.g. 42" and 42''').

In some embodiments, a method of suppressing the growth of the innermost loop/section, 42' and 44', in the thickness direction using dams may be performed to form relatively narrow spaces between the coil and the dams and thus suppress movement and diffusion of copper ions ($Cu^{2+}$)

introduced into the spaces, thereby significantly decreasing the growth of the innermost loop/section 42' and 44' in the thickness direction.

A dam can be formed by any suitable method, but may be formed using a general insulating material such as a dry film resist (DFR), a solder resist (SR), or the like. In addition, a shape of the dam is not particularly limited, and a height of the dam is not limited. However, the dam may be installed at a height equal to or higher or lower than a target height of the coil conductor pattern or a portion or a loop or section of the coil conductor pattern.

A process of forming the coil conductor patterns is only an example and is not limited thereto. For example, various different methods may be used.

While FIG. 3 shows only the innermost loop/section 42' to be configured only of the pattern plating layer 42a, two or more adjacent, or otherwise, loops/sections may be configured only of the pattern plating layer 42a.

According to an exemplary embodiment of the present disclosure, in the case that a width of the innermost loop/section 42' of the coil conductor pattern 42 is Wo1, a width of the outermost loop/section 42''' thereof is Wo2, and a width of one or more or all of the innerloop/section 42", located between the outermost loop/section and the innermost loop/section is Wi, Wo1<Wi<Wo2 may be satisfied.

In some embodiments, the improved coil structure can have improved inductor characteristics and may have widths of the coil loops/sections that are reduced in thickness from the outermost loop/section toward the innermost loop/section, for example, from the outer portion of the magnetic material body toward the inner portion thereof.

However, coil structures made previously by substrate plating processes have not included the above-described improved coil structure features. As a result, previous coil patterns have limitations in the characteristics of the inductors made by substrate plating.

According to an exemplary embodiment in the present disclosure, the width Wo1 of the innermost loop/section 42' of the coil conductor pattern 42 and the width Wi of the inner loop/section (e.g. 42") adjacent to the innermost loop/section 42', or elsewhere, are controlled so as to satisfy Wo1<Wi, such that the improved coil structure in which the widths of the coils are reduced in thickness from the outer portion of the magnetic material body toward the inner portion thereof may be implemented, whereby the quality factor, for example, the Q factor, of the chip inductor may be improved.

The widths of the outermost loops/sections 42''' and 44''', the innermost loops/sections 42' and 44', and the inner loops/sections (e.g. 42" and 44"), of the coil conductor patterns 42 and 44 may be defined as distances between left end surfaces and right end surfaces of the respective loops/sections of the coil conductor patterns in the cross section of the magnetic material body 50 in the length direction, as shown in FIGS. 3 and 4.

Generally, various techniques of plating may be important in order to improve a DC resistance (Rdc) as well as other characteristics of a thin film type inductor. In some cases, an anisotropic plating method of applying high density current to grow plating in only, or preferentially or primarily, a direction upward of a coil can be used.

Anisotropic plating is a technology that can include suppressing growth of the coil in the width direction and growing the coil in an upward direction (entirely, primarily, or substantially) through application of high density current at a relatively low inorganic material concentration to implement a high aspect ratio (A/R) of the coil conductor pattern, such that a core area may be secured, thereby preventing deterioration of efficiency and having improved DC resistance (Rdc).

However, a technology of forming the coils of the chip inductor using an anisotropic plating method can have problems in that the outermost and innermost loops/sections can also grow in the width direction, such that cross-sectional areas thereof are non-uniform.

The DC resistance (Rdc), a characteristic of the chip electronic component, has a value that becomes lower as cross-sectional areas of the coils become larger, and generally coils having the same volume have a lower resistance value in the case in which cross-sectional areas thereof are uniform.

In the case that the outermost and innermost coils are grown in the width direction to have non-uniform cross-sectional areas, the DC resistance (Rdc), which is a characteristic of the chip inductor, may not be improved.

According to an exemplary embodiment in the present disclosure, the improved coil structure in which the widths of the loops/sections are reduced in thickness from the outer portion of the magnetic material body toward the inner portion thereof may be implemented, such that the DC resistance (Rdc) characteristic may be improved.

A method of implementing the improved coil structure in which the widths of the loops/sections are reduced in thickness from the outer portion of the magnetic material body 50 toward the inner portion thereof by controlling the width Wo1 of the respective innermost loop/section 42' and 44' of the coil conductor patterns 42 and 44 and the width Wi of inner loops/sections (e.g. 42" and 44"), for example adjacent to the innermost loop/section 42' and 44' so as to satisfy Wo1<Wi as described above may be implemented by various techniques including suppressing the growth of the innermost loop/section 42' and 44' in the width direction, for example, in the case in which the secondary lead wire plating is applied to the innermost loop/section 42' and 44'.

In some embodiments, a method of suppressing the growth of the innermost loop/section 42' and 44' in the width direction may be implemented by installing dams on the side surfaces and/or the upper surfaces of the innermost loop/section 42' and 44', as described above.

For example, the dams can be installed at predetermined intervals on the side surfaces and/or the upper surfaces of the innermost loop/section 42' and 44', whereby the growth of the innermost loop/section 42' and 44' in the width direction may be suppressed even though the secondary lead wire plating is applied to the innermost loop/section 42' and 44'.

In some embodiments, the dam can be installed on the side surfaces and/or the upper surface of the pattern plating layer 42a previously formed, and the dams can be installed in order to prevent or limit growth of an electroplating layer on the innermost loop/section 42', such as electroplating to provide a secondary lead wire, whereby the innermost loop/section 42' may be implemented so as to have a width and/or a thickness smaller than that of an inner loop/section (e.g. 42").

In one embodiment of the present disclosure, in the case that a width of the respective outermost loop/section 42''' of the coil conductor pattern 42 is Wo2, Wo2>Wi may be satisfied.

In the case in which the secondary lead wire plating is applied to the innermost coil loop/section 42' and 44', the growth of the innermost coil conductor patterns 42' and 44' in the width direction may be suppressed, and since the secondary lead wire plating can be performed on the pattern plating layers of the outermost loop/section 42''' and 44''' by an appropriate method, the growth of the outermost loops/sections 42''' and 44''' in the width direction may be promoted. Thus, in the case of the outermost loop/section 42''', the width Wo2 thereof may satisfy Wo2>Wi.

Further, in some embodiments, the width Wo2 of the outermost loop/section 42''', the width Wi of one or more or all of the inner loops/sections (e.g. 42''), and the width Wo1 of the innermost coil conductor pattern 42' may satisfy Wo2>Wi>Wo1.

Thus, the improved coil structure in which the widths of the coils are reduced in thickness from the outer portion of the magnetic material body toward the inner portion thereof may be implemented, such that a quality factor, for example, the Q factor, of the chip inductor may be improved, and/or the DC resistance (Rdc) characteristics may be improved.

The widths of inner loops/sections (e.g. 42'' and 44'') between the outermost loop/section 42''' and 44''' and the innermost loop/section 42' and 44' of the coil conductor patterns 42 and 44, respectively, may be the same as each other, but are not limited thereto.

Since coil conductor pattern loops/sections capable of performing competition at the time of performing the secondary lead wire plating are present for the inner loops/sections 42'' and 44'' at both side surfaces thereof unlike the outermost loop/sections 42''' and 44''' and the innermost loop/sections 42' and 44', the inner loops/sections 42'' and 44'' may be implemented in a similar shape to each other and with similar width/thickness.

The meaning that the widths of the inner loops/sections 42'' and 44'' can be the same as each other is not that they coincide with each other without slight error, but includes the meaning that they are similar to each other. Therefore, differences within a predetermined range may occur due to process variation. In some embodiments, the variation can be less than about 1% or less than about 2% or less than about 3% or less than about 5% or less than about 8% or in some embodiments as high as about 10, 12 or 15%.

In some embodiments, the innermost loop/section 42' of the coil conductor pattern 42 may be configured only of or partially of the pattern plating layer 42a, and the inner and outermost loops/sections 42'' and 42''' thereof may include the pattern plating layer 42a and an electroplating layer 42b formed on the pattern plating layer 42a, but is not limited thereto.

According to an exemplary embodiment in the present disclosure, dams can be formed on the side surfaces and/or the upper surfaces of the innermost loop/section 42' in order to suppress the growth of the innermost loop/section 42' in the width and thickness directions so that the electroplating plating layer 42b may not be formed on, or would be limited for, the innermost loop/section 42' at the time of performing the secondary lead wire plating.

Therefore, the innermost loop/section 42' may be configured of the pattern plating layer 42a, and may have a relatively small width and thickness unlike the remaining loops/sections of the coil conductor pattern.

In some embodiments, the inner and outermost loops/sections themselves can be implemented by any appropriate process without being limited to being implemented by a special process, and they may include a pattern plating layer 42a and an electroplating layer 42b formed on the pattern plating layer 42a.

Although not shown in FIGS. 1 through 4, an anisotropic plating layer may be further formed on the electroplating layer 42b. However, the present disclosure is not limited thereto.

Figure 5:
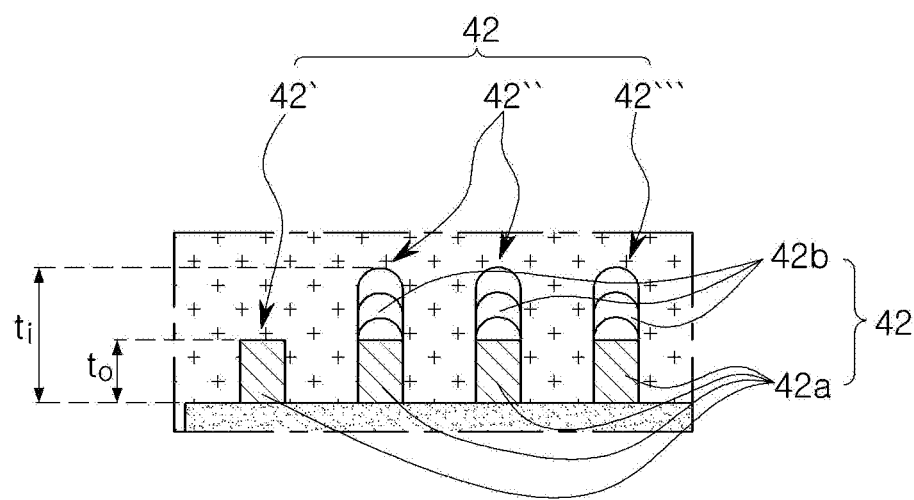
FIG. 5 is an enlarged schematic view of part A of FIG. 3 according to another embodiment in the present disclosure.

FIG. 5 is an enlarged schematic view of part A of FIG. 3 according to another embodiment of the present disclosure.

Referring to FIG. 5, in a chip electronic component according to another embodiment of the present disclosure, the innermost loop/section 42' may be configured only or partially of the pattern plating layer 42a, and the remaining loops/sections 42'' and 42''' may include a pattern plating layer 42a and an electrode plating layer 42b formed on the pattern plating layer 42a. Here, the electroplating layer 42b may have a shape grown in only a thickness direction of the pattern plating layer 42a.

For example, the electroplating layer 42b, which can be an anisotropic plating layer formed by anisotropic plating rather than isotropic plating, may be suppressed from being grown in the width direction of the pattern plating layer 42a and may be grown and disposed in only the thickness direction of the pattern plating layer 42a.

Therefore, the coil conductor patterns 42 and 44 may be implemented at a fine line width, such that a relatively high inductance value may be obtained and the DC resistance (Rdc) and the quality factor, for example, the Q factor may be improved.

Meanwhile, according to another embodiment in the present disclosure, a chip electronic component may include a magnetic material body 50 including an insulating substrate 23 and coil conductor patterns 42 and 44 formed on at least one surface of the insulating substrate 23; and external electrodes 31 and 32 formed on surface (s) or on both end portions of the magnetic material body 50, respectively, so as to be connected to end portions of the coil conductor patterns 42 and 44, respectively. Here, in the case that in a cross section of the magnetic material body 50 in the length direction, a width of the innermost loop/section 42' of the coil conductor pattern 42 is Wo1 and a width of inner loop(s)/section(s) 42'' adjacent to the innermost coil conductor pattern 42' is Wi, Wo1<Wi may be satisfied.

According to another embodiment in the present disclosure, in the case that a width of the outermost loop/section 42''' of the coil conductor pattern 42 is Wo2, Wo2>Wi may be satisfied.

For example, in the case in which the secondary lead wire plating is applied to the innermost loops/sections 42' and 44', the growth of the innermost loops/sections 42' and 44' in the width direction may be suppressed, and since the secondary lead wire plating can be performed on the pattern plating layers of the outermost coil conductor patterns 42''' and 44''' by any appropriate method, the growth of the outermost coil conductor patterns 42''' and 44''' in one direction, the width direction, may be promoted. For example, in the case of the outermost loop/section 42''', the width Wo2 thereof may satisfy Wo2>Wi as illustrated in FIG. 4.

Therefore, the width Wo2 of the respective outermost loop/section, the width Wi of the respective inner loops/sections, and the width Wo1 of the respective innermost loop/section may satisfy Wo2>Wi>Wo1.

For example, the improved coil structure in which the widths of the coils can be reduced in thickness from the outer portion of the magnetic material body toward the inner portion thereof may be implemented, such that the quality factor, for example, the Q factor, of the chip inductor may be improved, and the DC resistance (Rdc) characteristics may be improved.

In some embodiments, the widths of the inner loops/sections between the outermost loop/section and the innermost loop/section of the coil conductor patterns 42 and 44 may be the same as each other, but are not limited thereto.

In some embodiments, a thickness of the respective innermost loop/section 42' and 44' of the coil conductor patterns 42 and 44 may be smaller than that of the respective remaining inner and outermost loops/sections 42", 42''', 44", and 44''' thereof.

For example, since the dams can be installed on the side surfaces and/or the upper surfaces of the innermost loops/sections in order to suppress the growth of the innermost loop/section in the width direction, the growth of the innermost loop/section in the thickness direction may also be suppressed.

In some embodiments, the growth of the innermost loop/section in the width direction may be suppressed, such that the improved coil structure in which the widths of the loops/sections can be reduced in thickness from the outer portion of the magnetic material body toward the inner portion thereof may be implemented, and the respective innermost loop/section can be formed at a thickness smaller than that of the respective remaining coil conductor patterns, such that a more improved coil structure may be achieved.

Therefore, an improvement effect of the quality factor, for example, the Q factor, and the DC resistance (DC) characteristics of the chip inductor according to an exemplary embodiment in the present disclosure may be more excellent.

According to another embodiment of the present disclosure, the innermost loop/section 42' of the coil conductor pattern 42 may be configured of the pattern plating layer 42a, and the remaining inner and outermost loops/sections 42" and 42''' thereof may include the pattern plating layer 42a and the electroplating layer 42b formed on the pattern plating layer 42a, but are not limited thereto.

A description for features that are the same as those of the chip electronic component according to the foregoing embodiment of the present disclosure described above among features of the chip electronic component according to another embodiment in the present disclosure will be omitted in order to avoid an overlapped description.

According to another embodiment in the present disclosure, a chip electronic component may include a magnetic material body 50 including an insulating substrate 23 and coil conductor patterns 42 and 44 formed on at least one surface of the insulating substrate 23; and external electrodes 31 and 32 disposed on one or more surfaces or on both end portions of the magnetic material body 50, respectively, so as to be connected to end portions of the coil conductor patterns 42 and 44, respectively. Here, describing the case of the coil conductor pattern 42, in the case that in a cross section of the magnetic material body 50 in the length direction, a width of the innermost loop/section 42' of the coil conductor pattern 42 is Wo1 and a width of the outermost loop/section 42''' thereof is Wo2, Wo1<Wo2 may be satisfied.

In the case that a width of one or more or all of the inner loops/sections (e.g. 42") between the outermost loop/section 42''' and the innermost loop/section 42' of the coil conductor pattern 42 is Wi, Wo1<Wi<Wo2 may be satisfied.

The widths of the inner loops/sections (e.g. 42" and 44") between the outermost loop 42''' and 44''' and the innermost loop/section 42' and 44' of the coil conductor patterns 42 and 44, respectively, may be the same as each other.

A thickness of the respective innermost loop/section 42' and 44' of the coil conductor patterns 42 and 44 may be smaller than that of the respective remaining inner and outermost loops/sections 42", 42''', 44", and 44''' thereof.

The innermost loop/section 42' of the coil conductor pattern 42 may be configured of the pattern plating layer 42a, and the remaining inner and outermost loops/sections 42" and 42''' thereof may include the pattern plating layer 42a and the electroplating layer 42b formed on the pattern plating layer.

A description for features that are the same as those of the chip electronic component according to the foregoing embodiment in the present disclosure described above among features of the chip electronic component according to another embodiment in the present disclosure will be omitted in order to avoid an overlapped description.

According to another embodiment in the present disclosure, a chip electronic component may include a magnetic material body 50 including an insulating substrate 23 and coil conductor patterns 42 and 44 formed on at least one surface of the insulating substrate 23; and external electrodes 31 and 32 disposed on one or more surfaces or on both end portions of the magnetic material body 50, respectively, so as to be connected to end portions of the coil conductor patterns 42 and 44, respectively. Here, in a cross section of the magnetic material body 50 in the length direction, the innermost loop/section 42' of the coil conductor pattern 42 may be configured of the pattern plating layer 42a, and the remaining inner and outermost loop/section 42" and 42''' thereof may include a pattern plating layer 42a and an electroplating layer 42b formed on the pattern plating layer 42a.

In the case that a width of the respective innermost loop/section 42' of the coil conductor pattern 42 is Wo1, a width of the outermost loop/section 42''' thereof is Wo2, and a width of inner loop(s)/section(s) (e.g. 42") between the outermost loop/section 42''' and the innermost loop/section 42' is Wi, Wo1<Wi<Wo2 may be satisfied.

The widths of the internal coil conductor patterns between the outermost loop/section and the innermost loop/section of the coil conductor patterns 42 and 44 may be the same as each other.

A thickness of the respective innermost loops/sections 42' and 44' of the coil conductor patterns 42 and 44 may be smaller than that of the respective remaining inner and outermost loops/sections 42", 42''', 44", and 44''' thereof.

A description for features that are the same as those of the chip electronic component according to the foregoing embodiment in the present disclosure described above among features of the chip electronic component according to another embodiment in the present disclosure will be omitted in order to avoid overlapped descriptions.

Figure 6A:
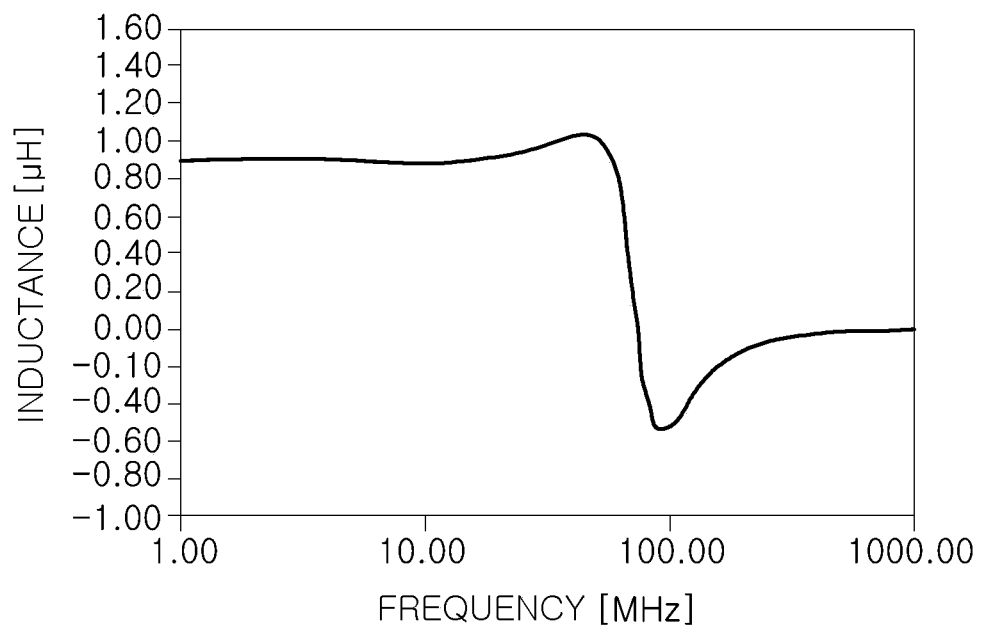
FIGS. 6A and 6B are graphs illustrating inductance and Q factor, as a function of frequency, for a chip electronic component according to Comparative Example.
Figure 6B:
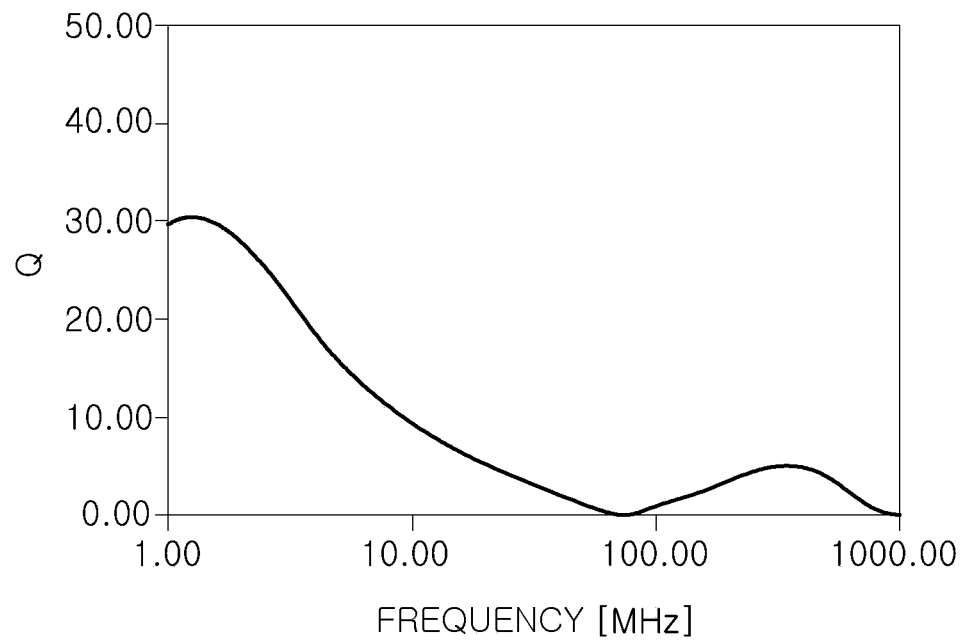

FIGS. 6A and 6B are graphs illustrating inductances and Q factors, as a function of frequency, of a chip electronic component according to a Comparative Example.

Figure 7A:
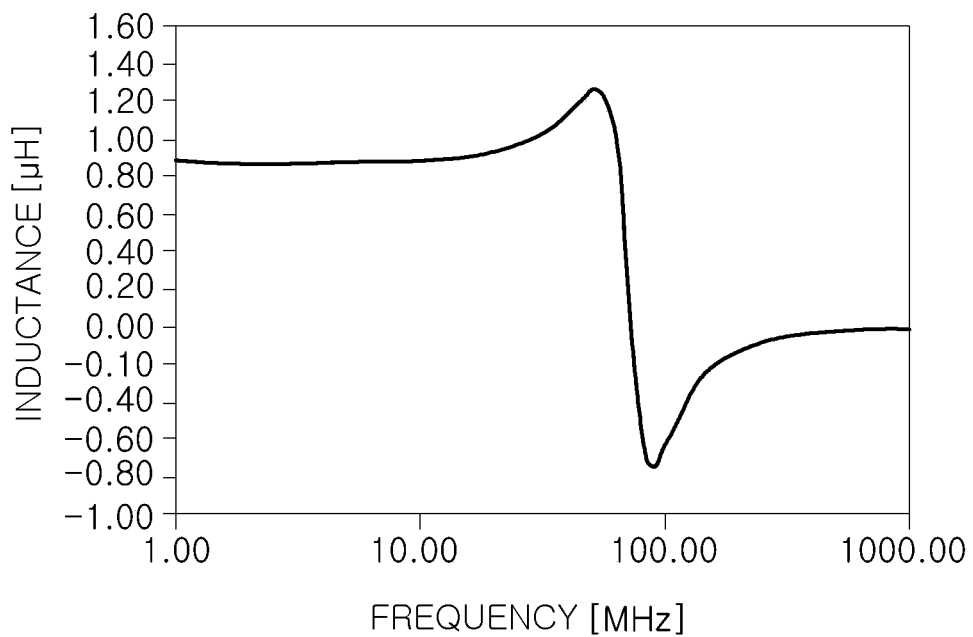
FIGS. 7A and 7B are graphs illustrating inductance and Q factor, as a function of frequency, for a chip electronic component according to an Embodiment of the present disclosure.
Figure 7B:
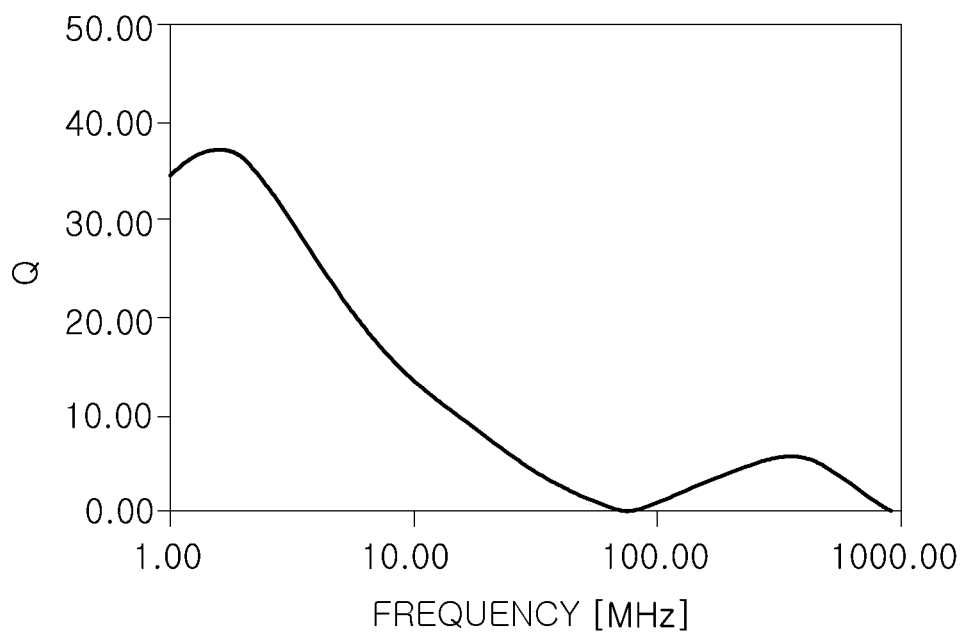

FIGS. 7A and 7B are graphs illustrating inductances and Q factors, as a function of frequency, of a chip electronic component according to an Embodiment of the present disclosure.

Referring to FIGS. 6A through 7B, it may be appreciated that inductances, for each frequency, of a chip electronic component according to Comparative Example and inductances, for each frequency, of a chip electronic component according to an Embodiment of the present disclosure are similar to each other.

On the other hand, it may be appreciated that Q factors, which are quality factors of a chip electronic component for each frequency, are superior in the Embodiment of the present disclosure than in the Comparative Example.

Next, a process of manufacturing a chip electronic component according to an exemplary embodiment in the present disclosure will be described.

First, the coil conductor patterns 42 and 44 may be formed on the insulating substrate 23.

The coil conductor patterns 42 and 44 may be formed on the insulating substrate 23 configured of a thin film, by an electroplating method, or the like. Here, the insulating substrate 23 is not particularly limited, but may be, for example, a printed circuit board (PCB), a ferrite substrate, a metal based soft magnetic substrate, or the like, and may have a thickness of 40 to 100 μm.

A method of forming the coil conductor patterns 42 and 44 may be, for example, an electroplating method, but is not limited thereto. The coil conductor patterns 42 and 44 may be formed using a metal having excellent electrical conductivity, for example, silver (Ag), palladium (Pd), aluminum (Al), nickel (Ni), titanium (Ti), gold (Au), copper (Cu), platinum (Pt), or alloys thereof, etc.

A hole may be formed in a portion of the insulating substrate 23 and may be filled with a conductive material to form the via electrode 46, and the coil conductor patterns 42 and 44 formed on one surface and the other surface of the insulating substrate 23, respectively, may be electrically connected to each other through the via electrode 46.

Drilling, laser processing, sand blasting, punching, or the like, may be performed on a central portion of the insulating substrate 23 to form the hole penetrating through the insulating substrate 23.

The coil conductor patterns 42 and 44 may be formed by forming the electroplating layers on the pattern plating layers formed by a printing method, by the secondary lead wire plating.

According to an exemplary embodiment in the present disclosure, the dams can be formed on side surfaces and/or upper surfaces of the pattern plating layers that become the innermost coil conductor patterns by a method such as a printing method, or the like, in a process of forming the coil conductor patterns, whereby growth of the pattern plating layers of the innermost coil conductor patterns in the width direction and the thickness direction may be suppressed.

Next, magnetic material layers may be stacked on and below the insulating substrate 23 having the coil conductor patterns 42 and 44 respectively formed thereon, to form the magnetic material body 50.

The magnetic material layers may be stacked on both surfaces of the insulating substrate 23 to then be compressed by a laminate method or an isostatic press method to form the magnetic material body 50. Here, the hole may be filled with the magnetic material to form the core part.

In addition, the external electrodes 31 and 32 connected to the coil conductor patterns 42 and 44 exposed to end surface (s) or surface (s) elsewhere on the magnetic material body 50 may be formed.

The external electrodes 31 and 32 may be formed using a paste containing a metal having excellent electrical conductivity, for example, a conductive paste containing nickel (Ni), copper (Cu), tin (Sn), or silver (Ag), or alloys thereof, etc. The external electrodes 31 and 32 may be formed by a dipping method, or the like, as well as a printing method depending on a shape thereof.

A description of features that are the same as those of the chip electronic component according to the foregoing embodiment in the present disclosure described above will be omitted.

In the various embodiments disclosed herein, the inner loops/sections, denoted by 42" and 44" can include 0, 1, 2, 3, 4, 5 or more loops/sections, unless the context the indicates otherwise.

In some embodiments, the innermost loop/section can comprise a pattern printed layer without an additional electroplated layer.

Board for Mounting of Chip Electronic Component

Figure 8:
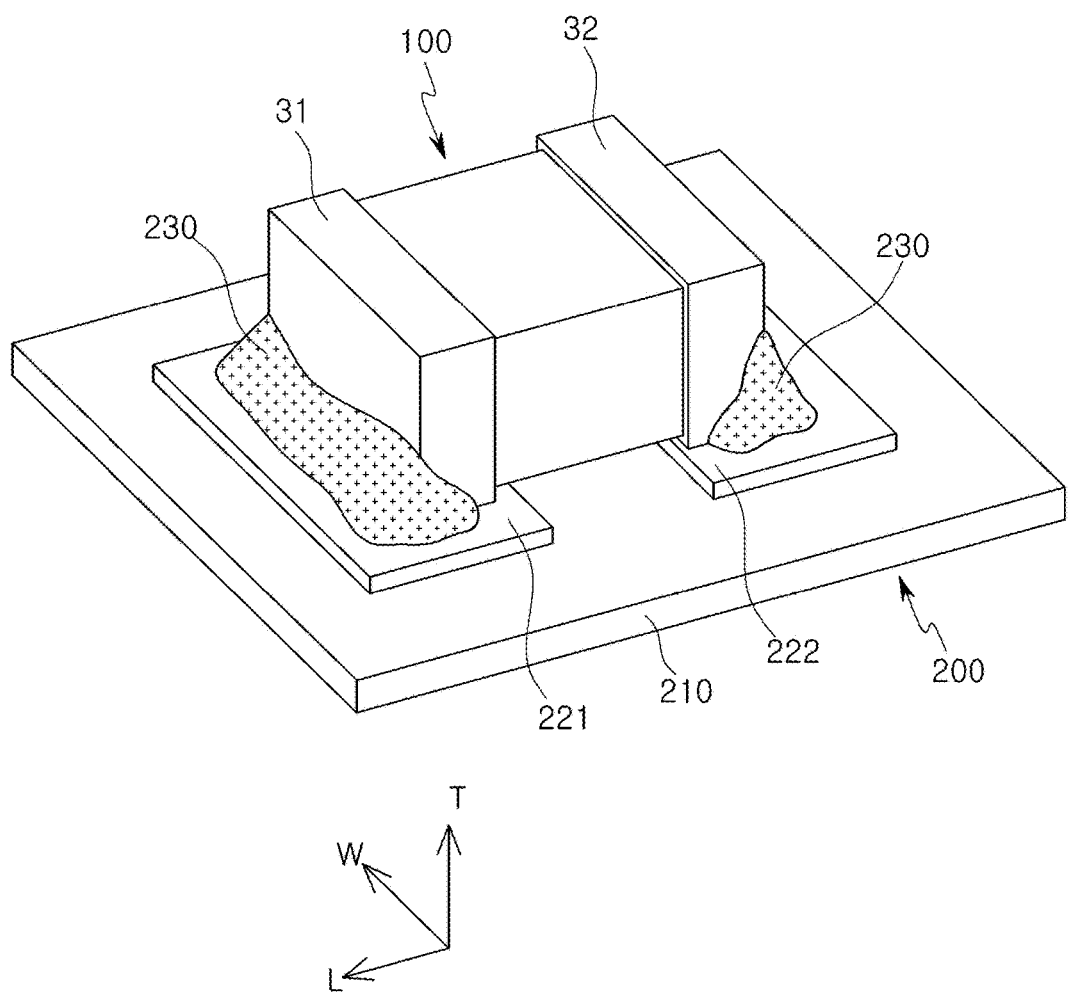
FIG. 8 is a perspective view illustrating a form in which the chip electronic component of FIG. 1 is mounted on a printed circuit board.

FIG. 8 is a perspective view illustrating a form in which the chip electronic component of FIG. 1 is mounted on an exemplary printed circuit board.

Referring to FIG. 8, a board 200 for mounting of a chip electronic component 100 according the embodiment in the present disclosure may include a printed circuit board 210 on which the chip electronic component 100 is mounted so as to be in parallel therewith and first and second electrode pads 221 and 222 formed on an upper surface of the printed circuit board 210 so as to be spaced apart from each other.

Here, the first and second external electrodes 31 and 32 of the chip electronic component 100 may be electrically connected to the printed circuit board 210 by solders 230 in a state in which they are positioned on the first and second electrode pads 221 and 222, respectively, so as to contact the first and second electrode pads 221 and 222, respectively.

A description for features overlapping with those of the chip electronic component according to the foregoing embodiment of the present disclosure described above except for the above-mentioned description will be omitted.

With the chip electronic component according to embodiments in the present disclosure, metal coil patterns configuring the inductor may have specific coil line widths and plating thicknesses at a required position.

In addition, with the chip electronic component according to embodiments in the present disclosure, the quality factor, for example, the Q factor, of the chip inductor may be improved as compared with the related art.

Further, turns of the coils of the chip inductor can have some features similar to those of the coils of the chip inductor according to the related art, such that an inductance of the chip inductor may be maintained so as to be similar to that of the chip inductor according to the related art. Line widths and plating thicknesses of the coil conductor patterns at each position can be controlled, whereby the Q factor of the chip inductor may be improved.

Meanwhile, with the chip electronic component according to embodiments in the present disclosure, the DC resistance (Rdc) characteristics may be improved.

While exemplary embodiments have been shown and described above, it will be apparent to those skilled in the art that modifications and variations could be made without departing from the scope of the present invention as defined by the appended claims.

What is claimed is:

1. A chip electronic component comprising:
 a magnetic material body including
  an insulating substrate and
  a coil conductor pattern disposed on at least one surface of the insulating substrate, the coil conductor comprising a plurality of loops/sections, the plurality of loops/sections including an innermost loop/section and remaining loops/sections;
 external electrodes disposed on external portions of the magnetic material body to be connected to end portions of the coil conductor patterns,
 wherein in a cross section of the magnetic material body in a length direction, and a thickness of the innermost loop/section is smaller than thicknesses of the at least two of the remaining loops/sections of the coil conductor patterns,
 wherein the innermost loop/section comprises one or more pattern plating layers, and the remaining loops/ sections comprise one or more pattern plating layers, at least one electroplating layer is formed on the one or more pattern plating layers, and the at least one electroplating layer is not present on the innermost loop/section, and a number of the electroplating layers of the innermost loop/section of the coil conductor pattern is different from a number of the electroplating layers of the remaining loops/sections of the coil conductor pattern.

2. The chip electronic component of claim 1, wherein the remaining loops/sections comprises an outermost loop/section and at least one inner loop/section, the inner loop/section located between the outermost loop/section and the innermost loop/section, wherein a width of the innermost loop/section of the coil conductor pattern is Wo1, a width of the outermost loop/section of the coil conductor pattern is Wo2, and a width of the at least one inner loop/section is Wi, and Wo1<Wi<Wo2.

3. The chip electronic component of claim 1, wherein the remaining loops/sections comprises at least one inner loop/section and an outermost loop/section, wherein each of the at least one inner loop/section has a width and each of the widths of the inner loops/sections are the same as each other.

4. A board for mounting of a chip electronic component, comprising:

a printed circuit board having first and second electrode pads disposed on the printed circuit board; and the chip electronic component of claim 1 installed on the printed circuit board.

5. The chip electronic component of claim 1, a width of the at least one electroplating layer on a side of the pattern plating layer of the outermost loop/section farthest from the innermost loop/section is greater than a width of the electroplating layer on a side opposite to the farthest side.

6. The chip electronic component of claim 1, wherein the thicknesses of at least two adjacent loops/sections of the remaining loops/sections are the same as each other, and a number of the plating layers of the innermost loop/section of the coil conductor pattern is more than a number of the plating layers of the remaining loops/sections of the coil conductor pattern.

7. A chip electronic component comprising:

a magnetic material body including an insulating substrate and a coil conductor pattern disposed on at least one surface of the insulating substrate, the coil conductor pattern comprising an innermost loop/section and at least two adjacent inner loops/sections located adjacent to each other and adjacent to the innermost loop/section;

external electrodes disposed on both end portions of the magnetic material body to be connected to end portions of the coil conductor patterns, wherein in the case that in a cross section of the magnetic material body in a length direction, and a width of the innermost loop/section is Wo1 and a width of each of the at least two inner loops/sections is Wi, and Wo1<Wi, wherein the innermost loop/section comprises one or more pattern plating layers, and the remaining loops/sections comprise one or more pattern plating layers, at least one electroplating layer is formed on the one or more pattern plating layers, and the at least one electroplating layer is not present on the innermost loop/section, and a number of the electroplating layers of the innermost loop/section of the coil conductor pattern is different from a number of the electroplating layers of the remaining loops/sections of the coil conductor pattern.

8. The chip electronic component of claim 7, the coil conductor pattern further comprising an outermost loop/section, wherein a width of the outermost loop section is Wo2, and Wo2>Wi.

9. The chip electronic component of claim 7, wherein the coil conductor pattern further comprising an outermost loop/section and the at least two inner loops/sections are located between the innermost loop/section and the outermost loop/section, the inner loops/sections each having a width, and all of the widths of the inner loops/sections located between the innermost loop/section and the outermost loop/section are the same as each other.

10. The chip electronic component of claim 7, the coil conductor pattern optionally comprising additional loops/sections located outbound of the at least two inner loops/sections, each of the additional loops/sections having a thickness, wherein a thickness of the innermost loop/section is smaller than a thickness of the inner loop/section and each thickness of the additional loops/sections.

11. The chip electronic component of claim 7, the coil conductor pattern optionally comprising additional loop/sections, wherein the innermost loop/section comprises one or more pattern plating layers and the inner and additional loops/sections comprise one or more pattern plating layers and one or more electroplating layers formed on the one or more pattern plating layers, wherein at least one of the one or more pattern plating layers is not present on the innermost loop/section.

12. A board for mounting of a chip electronic component, comprising:

a printed circuit board having first and second electrode pads disposed on the printed circuit board; and the chip electronic component of claim 7 installed on the printed circuit board.

13. The chip electronic component of claim 7, wherein the widths of the at least two adjacent inner loops/sections are the same as each other, and a number of the plating layers of the innermost loop/section of the coil conductor pattern is more than a number of the plating layers of the remaining loops/sections of the coil conductor pattern.

14. A chip electronic component comprising:

a magnetic material body including an insulating substrate and coil conductor patterns disposed on at least one surface of the insulating substrate, the coil conductor patterns comprising an innermost loop/section, a plurality of inner loops/sections located outboard to the innermost loop/section, and an outermost loop section positioned outboard to the innermost loop/section and outboard to the inner loops/sections;

first and second external electrodes disposed on first and second end portions of the magnetic material body configured for connection to end portions of the coil conductor patterns, wherein in the case that in a cross section of the magnetic material body in a length direction, widths of at least two adjacent inner loops/sections of the plurality of inner loops/sections are different from a width of the innermost loop/section Wo1 which is related to a width of the outermost loop/section Wo2 by a relationship of Wo1<Wo2, wherein the innermost loop/section comprises one or more pattern plating layers, and the remaining loops/ sections comprise one or more pattern plating layers, at least one electroplating layer is formed on the one or more pattern plating layers, and the at least one electroplating layer is not present on the innermost loop/section, and a number of the electroplating layers of the innermost loop/section of the coil conductor pattern is different from a number of the electroplating layers of the remaining loops/sections of the coil conductor pattern.

15. The chip electronic component of claim 14, wherein a width of one or more inner loops/sections located between the innermost loop/section and the outermost loop/section is Wi, and Wo1<Wi<Wo2.

16. The chip electronic component of claim 14, wherein each of the inner loops/sections have a width and all of the widths of the inner loops/sections located between the outermost loop/section and the innermost loop/section are the same as each other.

17. The chip electronic component of claim 14, wherein a thickness of the innermost loop/section is smaller than a thickness of the outermost loop/section.

18. The chip electronic component of claim 14, wherein the innermost loop/section comprises one or more pattern plating layers, and the outermost loop/section comprises one or more pattern plating layers and one or more electroplating layers formed on the pattern plating layers, wherein at least one of the one or more electroplating layers is not present on the innermost loop/section.

19. A board for mounting of a chip electronic component, comprising:

a printed circuit board having first and second electrode pads disposed on the printed circuit board; and the chip electronic component of claim 14 installed on the printed circuit board.

20. The chip electronic component of claim 14, wherein the widths of at least two adjacent inner loops/sections of the plurality of inner loops/sections are the same as each other, and a number of the plating layers of the innermost loop/section of the coil conductor pattern is more than a number of the plating layers of the remaining loops/sections of the coil conductor pattern.

21. A chip electronic component comprising:

a magnetic material body including an insulating substrate and at least one coil conductor patterns disposed on at least one surface of the insulating substrate, the magnetic material body further comprising two ends;

external electrodes disposed on both end portions of the magnetic material body to be connected to end portions of the coil conductor patterns, wherein in a cross section of the magnetic material body in a length direction, an innermost loop/section of a plurality of loops/sections of each of the at least one coil conductor patterns is configured of one or more pattern plating layers, and remaining loops/sections of the plurality of loops/sections of each of the at least one coil conductor patterns include one or more pattern plating layers and one or more electroplating layers formed on the one or more pattern plating layers, and the innermost loop/section does not include at least one of the one or more electroplating layers, wherein the innermost loop/section comprises one or more pattern plating layers, and the remaining loops/sections comprise one or more pattern plating layers, at least one electroplating layer is formed on the one or more pattern plating layers, and the at least one electroplating layer is not present on the innermost loop/section, and a number of the electroplating layers of the innermost loop/section of the coil conductor pattern is different from a number of the electroplating layers of the remaining loops/sections of the coil conductor pattern.

22. The chip electronic component of claim 21, wherein the remaining loops/sections comprise an outermost loop/section and a plurality of inner loops/sections, wherein the inner loops/sections are positioned between the innermost loop/section and the outermost loop/section, and a width of the innermost loop/section is Wo1, a width of the outermost loop/section is Wo2, and a width of one of the plurality of inner loops/sections is Wi, and Wo1<Wi<Wo2.

23. The chip electronic component of claim 21, wherein the remaining loops/sections comprise a plurality of inner loops/sections and an outermost loop/section, wherein the inner loops/sections are positioned outward of the innermost loop/section and the outermost loop/section is positioned outward of the plurality of inner loops/sections, wherein each of the plurality of inner loops/sections has a width, and all of the widths of the plurality of inner loops/sections are the same as each other.

24. The chip electronic component of claim 21, wherein for at least one of the coil conductor patterns, a thickness of the innermost loop/section is smaller than a thickness of the remaining loops/sections.

25. A board for mounting of a chip electronic component, comprising:

a printed circuit board having first and second electrode pads disposed on the printed circuit board; and the chip electronic component of claim 21 installed on the printed circuit board.

26. The chip electronic component of claim 21, wherein thicknesses of at least two adjacent loops/sections of the remaining loops/sections are the same as each other, and a number of the plating layers of the innermost loop/section of the coil conductor pattern is more than a number of the plating layers of the remaining loops/sections of the coil conductor pattern.

* * * * *